(12) United States Patent
Walker

(10) Patent No.: US 6,384,439 B1
(45) Date of Patent: May 7, 2002

(54) DRAM MEMORY CELL AND ARRAY HAVING PASS TRANSISTORS WITH RECESSED CHANNELS

(75) Inventor: Darryl Walker, San Jose, CA (US)

(73) Assignee: Texas Instruments, Inc., TX (US)

( * ) Notice: Subject to any disclaimer, the term of this patent is extended or adjusted under 35 U.S.C. 154(b) by 0 days.

(21) Appl. No.: 09/241,267

(22) Filed: Feb. 1, 1999

Related U.S. Application Data
(60) Provisional application No. 60/073,327, filed on Feb. 2, 1998.

(51) Int. Cl.[7] .............................................. H01L 27/108
(52) U.S. Cl. ........................ 257/296; 306/401; 306/623
(58) Field of Search ........................ 257/296, 298–306, 257/401, 623, 59, 72, 347–355

(56) References Cited

U.S. PATENT DOCUMENTS
5,021,845 A * 6/1991 Hashimoto .................. 357/23.4
5,446,299 A * 8/1995 Acovic et al. ............... 257/316
5,604,368 A * 2/1997 Taur et al. ................... 257/348

FOREIGN PATENT DOCUMENTS
EP 557 581 A2 * 10/1992

OTHER PUBLICATIONS
Chan et al., "SOI MOSFET Design for All–Dimensional Scaling with Short Channel, Narrow Width and Ultra–thin Films", *IEDM 95*, pp. 631–634, 1995.
Choi et al., "Extremely Thin Film (10nm) SOI MOSFET Characteristics Including Inversion Layer to Accumulation Layer Tunneling", *IEDM 94*, pp. 645–648, 1994.

* cited by examiner

Primary Examiner—Nathan Flynn
Assistant Examiner—Ahmed N Sefer
(74) Attorney, Agent, or Firm—Darryl G. Walker

(57) ABSTRACT

A dynamic random access memory (DRAM) cell and associated array are disclosed. In a first embodiment, the DRAM cell (300) includes a storage capacitor (304) and a pass transistor (302). The pass transistor (302) is formed within a silicon mesa (310), and includes a source region (316), drain region (318) and channel region (320). The channel region (320) is formed below a furrow (322) that is inset with respect to the top surface of the silicon mesa (310). The channel region (320) has a smaller thickness than that of the source region (316) and drain region (318). A top gate (314) is disposed over the channel region (320). Due to the reduced thickness channel region (320), greater control of the operation of the pass transistor (302) is provided, including an off state with reduced source-to-drain leakage. The greater thickness of the source region (316) and drain region (318) (relative to the channel region (320)) provides greater immunity to the adverse effects of contact spiking.

33 Claims, 4 Drawing Sheets

DRAM MEMORY CELL AND ARRAY HAVING PASS TRANSISTORS WITH RECESSED CHANNELS

This application claims the benefit of Provisional Patent application Ser. No. 60/073,327, filed on Feb. 2, 1998.

TECHNICAL FIELD

The present invention relates generally to semiconductor devices, and more particularly to dynamic random access memory (DRAM) storage cells and arrays.

BACKGROUND OF THE INVENTION

As the complexity and power of computing systems increases, the amount of memory required for systems has also increased. This has resulted in the drive for semiconductor memory devices of increased storage capacity. At the same time, the desire for more efficient manufacturing and more compact electronic devices, has led to the competing interest of shrinking semiconductor memory devices to as small a size as possible.

A common type of semiconductor memory device is the dynamic random access memory (DRAM). DRAMs typically include a large number (millions or thousands) of memory cells, each of which can store at least one bit of data. The memory cells are usually arranged into an array configuration of rows and columns. Because the primary function of DRAM is to store data, the DRAM array makes up the majority of the area on a DRAM. Thus, any reduction in the size of a memory cell translates into reduced array size, and hence a smaller overall DRAM. Furthermore, a smaller memory cell allows more information to be stored in a given amount of area, leading to larger capacity DRAMs.

One reason for the increase in system computing power is the faster speeds at which such systems operate. For this reason, it is also desirable to provide a DRAM that has a fast operating speed, in order to provide data at a sufficient rate to a system. Another important aspect of DRAM operation arises from the fact that DRAMs are being used more often in battery operated applications, such as laptop computers. Thus, the rate of power consumption is an important feature of a DRAM. Lower power DRAMs can contribute to longer battery lifetimes in battery operated systems.

A typical DRAM array includes memory cells within the same row being commonly coupled to a word line, while memory cells within the same column are commonly coupled to a bit line. The data stored within the memory cells can be accessed according to various DRAM operations such as read operations, write operations and refresh operations. A memory cell access operation will usually begin with the application of an external memory address, resulting in the activation of a word line. Once activated, the word line couples the data stored within its respective row to the bit lines of the array.

The coupling of memory cells to bit lines results in differential voltage signals appearing on the bit lines (or bit line pairs). The differential signals are relatively small, and so must be amplified (usually by a sense amplifier), resulting in amplified data signals on the bit lines. The applied memory address also activates column decoder circuits, which connect a given group of bit lines to input/output circuits. Commonly, the memory address is multiplexed, with a row address being applied initially to select a word line, and a column address being applied subsequently to select the group of bit lines.

The typical DRAM memory cell stores data by placing charge on, or removing charge from, a storage capacitor. Once a storage capacitor has been initially charged, over time, the amount of charge will be reduced by way of a leakage current. Thus, it is important for the DRAM to restore the charge on the capacitor before the amount of charge falls below a critical level, due to leakage mechanisms. Restoration of charge is accomplished with a refresh operation.

The critical level of charge for a storage capacitor arises out of the minimum sensitivity of the DRAM sense amplifiers. The storage capacitor must have enough charge to create a sufficient differential voltage on the bit lines for the sense amplifier to reliably sense. The time needed before the charge on the capacitor falls below the critical level is commonly referred to as the maximum "pause" period. A DRAM must perform a refresh operation on every row in the device before that row experiences the maximum "pause" period, without having its cells refreshed by way of a refresh operation, read operation, or a write operation.

The refreshing operation of a DRAM consumes a relatively large amount of power. Minimizing the power used for refresh is thus a desirable goal. One way to reduce refresh power consumption is to reduce the rate of charge leakage from the storage capacitor. This increases the maximum pause period, allowing refresh operation to occur with less frequency.

Referring now to FIG. 1, a prior DRAM array is set forth and designated by the general reference character 100. The DRAM array 100 is arranged as an n×m array, having n rows coupled to n word lines (WL0–WLn) and m sets of bit line pairs (BL0, BL0_–BLm, BLm_). A memory cell is formed where a word line intersects a bit line pair. The memory cells are designated as M00–Mnm, where the first digit following the "M" represents the physical row of the memory cell's location, and the second digit represents the physical column of the memory cell's location. For example, M00 is the memory cell located at the intersection of WL0 and bit line pair BL0/BL0_. Each memory cell (M00–Mnm) contains a pass transistor (shown as n-channel MOSFETs Q00–Qnm) and a storage capacitor (shown as C00–Cnm).

The word lines of the DRAM array 100 are driven by a word line driver bank 102 coupled to the word lines (WL0–WLn). In addition, a sense amplifier bank 104 is coupled to the bit line pairs (BL0, BL0_–BLm, BLm_). The word line driver bank 102 is separated into n separate word line driver circuits, shown as DRV0–DRVn. The word line driver bank 102 is responsive to a row address (not shown) in such a manner, that only one word line driver circuit (DRV0–DRVn) will drive its corresponding word line high when the row address received. For example, word line driver circuit DRV0 will drive word line WL0 high when the row address value of "zero" is received, and word line driver circuit DRVn will drive word line WLn high when the row address value of "n" is received.

The sense amplifier bank 104 is separated into m separate sense amplifier circuits, shown as SA0–SAm. While all of the sense amplifiers 104 will be activated simultaneously, only selected of the sense amplifiers (SA0–SAm) will pass its sensed data to the DRAM outputs (not shown). A sense amplifier (SA0–SAm) will be selected according to the column address (not shown) applied to a column decoder (also not shown) in the DRAM.

As noted previously, data is stored in the DRAM array 100 by placing or removing charge from the storage capacitors (C00–Cnm). Each memory cell (M00–Mnm) is shown to further include a storage node 106–112 formed at the junction of the source of the pass transistor (Q00–Qnm), and its associated storage capacitor (C00–Cnm). The potential at the storage node will determine the logic of the data stored within the memory cell. A memory cell (Q00–Mnm) is accessed by coupling its storage node (106–112) to its respective bit line (BL0, BL0_–BLm, BLm_).

In a write cycle, a row address is applied to the DRAM and will activate a word line. If it is assumed that a logic value "1' is to be written into memory cell M00, word line driver circuit DRV0 will raise word line WL0 to a high voltage level. A column address will couple write circuitry (not shown) to bit line BL0 to allow a high logic level to be written into storage cell M00. The high logic level will be stored in memory cell M00 at storage node 106 by placing charge on storage capacitor C00. In order to ensure maximum charge is placed on the storage capacitor, word line driver circuit DRV0 will raise word line WL0 to a voltage level that is at least one n-channel threshold voltage (Vtn) above the voltage level applied to bit line BL0 during the write cycle.

Once the storage node 106 reaches a high logic level, which is typically equal to the high power supply voltage (Vcc) of the DRAM array 100, the DRAM is allowed to go into a precharge state in which word line WL0 will be driven to a low logic level, for example the low power supply voltage (Vss). In this state, the storage node 106 will be isolated from the bit line BL0 as the pass transistor Q00 will be in a non-conducting state.

Because the leakage characteristics of the storage capacitor C00 and pass transistor Q00 are not ideal, once the storage node 106 becomes isolated from the bit line BL0, the charge stored on the storage capacitor C00 will leak away, and the voltage will slowly begin to fall. As noted above, in order to ensure sufficient sensing of the data signal, the charge on the storage capacitor C00 must be restored before the charge level falls below the critical level. The data may be restored during either a read operation or a refresh operation, as determined by control signals (not shown) that may be applied to the DRAM. In both cases, the data of a complete row of DRAM cells will be restored.

In order to restore the data in the row formed by word line WL0, word line driver WL0, will be activated, raising word line WL0 at least one Vtn above the DRAM array 100 high power supply voltage (Vcc). As a result, the pass transistors coupled to word line WL0 will be turned on, coupling the storage nodes of the row to their respective bit lines BL0–BLm. This will create a differential voltage across the bit line pairs (BL0, BL0_–BLm, BLm_) having a value that is dependent upon the data stored at the accessed storage nodes. In the example described above, storage node 106 has a logic level "1" stored on it. Thus, during a read or refresh operation, when word line WL0 is accessed, bit line BL0 will rise to a potential that is a slightly higher than the potential of bit line BL0_. Conversely, if the storage node 106 had a logic level "0" stored on it, the bit line BL0 would achieve a lower voltage than that of bit line BL0_.

After a differential voltage is achieved on the bit lines (BL0, BL0_–BLm, BLm_), the sense amplifier bank 104 is activated. When activated, the sense amplifiers (SA0–SAm) amplify the voltage differential on the bit lines pairs (BL0, BL0_–BLm, BLm_), to generate output signals having a full logic level (either Vcc or Vss, depending upon the logic level stored in the memory cell).

Because the pass transistors coupled to word line WL0 are still turned on when the differential voltage signals are amplified, fall logic levels will be applied to the bit line pairs (BL0, BL0_ to BLm, BLm_). Referring back to the example of memory cell M00, because the memory cell stores a logic "1", sense amplifier SA0 will apply a voltage level of Vcc to bit line BL0 and a voltage of Vss to bit line BL0_. With word line WL0 at a voltage at least one Vtn above Vcc, a full Vcc level will be applied back to the storage node 106, and the voltage level on the storage node 106 will be restored. In this manner, all of the memory cells coupled to word line WL0 will have their data restored to a fall logic level (Vcc or Vss).

As mentioned above, a read or refresh operation must be performed on each row in the DRAM before the charge level on the storage node 106 falls below the critical level. Thus, it is important to make the pass transistor Q00 and storage capacitor C00 as ideal (i.e., have as little leakage) as possible. In addition, the critical charge level is dependent upon the capacitance of the storage capacitor C00: The larger the capacitance, the greater amount of charge that can be stored on the capacitor. Having more charge on the capacitor means that more charge can be lost before the total charge on the capacitor falls below the critical level. Thus, it is important to construct storage capacitors to have as large a capacitance as possible. While the capacitance of a DRAM cell storage capacitor can be increased by physically increasing the size of the storage cell, a drawback to such an approach is that the physical limitations of a DRAM cell layout that may place constraints on the size of the storage capacitor. Furthermore, increasing the size of the storage capacitor will result in a larger array size.

To better understand the physical constraints of conventional DRAM cells, a side cross sectional view of memory cell M00 is set forth in FIG. 2. The memory cell M00 is designated by the general reference character 200, and shown to include a pass transistor 202 and a storage capacitor 204 formed on a substrate 206. The pass transistor 202 couples the storage capacitor 204 to a bit line 208 in order to allow data to be read from, written to, or refreshed within, the memory cell 200.

The storage capacitor 204 includes a storage node 210 and a top plate 212 separated by a capacitor dielectric 214. The storage node 210 is formed from polysilicon and is coupled to the pass transistor 202. The capacitor dielectric 214 may be a silicon dioxide or a silicon dioxide-silicon nitride-silicon dioxide ($SiO_2$—$Si_3N_4$—$SiO_2$) combination. The top plate 212 is formed from polysilicon, and all storage cells on the DRAM array may share the same top plate 212. The top plate 212 may be maintained at a "plate" voltage having a potential equivalent to Vcc/2 in order to reduce the electric field across the capacitor dielectric 214.

The capacitance of the storage capacitor 204 is determined by the surface area of the storage node 210, the dielectric constant of the capacitor dielectric 214, and the thickness of the capacitor dielectric 214 (the distance between the top plate 212 and the storage node 210).

The pass transistor 202 is shown to include a source region 216 and a drain region 218 formed within the substrate 206. The substrate 206 is P-type doped silicon and the source region 216 and drain region 218 are N-type doped silicon. The P-N junction created between the substrate 206 and the source and drain regions (216 and 218) generates a parasitic junction capacitance which limits the performance of the pass transistor 202. The pass transistor 202 also includes a control gate 220 placed between the source region 216 and drain region 218, and separated from the substrate 206 by a thin control dielectric 222. The control gate 220 is polysilicon, and the thin control dielectric 222 may be silicon dioxide, or a combination silicon dioxide-nitride layer.

The pass transistor 202 is coupled to the storage capacitor 204 via the drain region 218. The pass transistor 202 is further coupled to a bit line contact 224 via the source region 216. The contact 224 is coupled to the bit line 208. The bit line 208 is a metal, for example Al, or alternatively, a titanium-tungsten combination (TiW). Due to smaller device geometries, the depth of the source and drain regions (216 and 218) (i.e., distance the source and drain extend into the substrate) is correspondingly small. A drawback to shallower sources and drains (216 and 218) can result from metal contacts extending through the source and/or drain to the substrate. Such contact "spiking" can result in a Schottky-barrier type junction, instead of P-N junctions.

In operation, when the control gate 220 is at a voltage that is one Vtn above that of the source 216, a low impedance path is formed between the storage node 210 and the bit line 208. In this manner, data can be read from, written to, or restored at the storage node 210. However, if the control gate 220 voltage is less than a threshold voltage above the source region 216 and drain region 218, the pass transistor 202 forms a high impedance path between the storage capacitor 204 and the bit line 208. In this manner, a low voltage on the control gate 220 (such as Vss) results in the isolation of the bit line 208 from storage node 210, and only unwanted leakage mechanisms may interfere with the data integrity.

One type of unwanted leakage mechanism is current that leaks from the drain region 218 to the source region 216 of the pass transistor 202. This current is represented by the character "Ileak" in FIG. 2. The current Ileak can be problematic, due to short channel effects resulting from a very short channel length. This raises a barrier to the limit to which transistor dimensions can be shrunk, which in turn, places a limitation on how small a DRAM array can be. Short channel effects will further effect the reliability of adjusting the threshold voltage of the pass transistor 202. Because the operation of the pass transistor 202 is dependent upon its threshold, it would be desirable to have greater control over the channel region of the pass transistor 202.

The control gate 220 runs the full length of the DRAM array in the row direction, forming the word line shown as WL0 in FIG. 1. Referring back to FIG. 1, each word line is shown to be coupled to the control gate of all the DRAM cells within its particular row. This arrangement results in a relatively large capacitive load on the word line. In order to reduce the speed required to drive the word line between high and low voltages, it is desirable to make the word line have as little resistance as possible. The polysilicon word line resistance may be reduced by forming a self-aligned silicide (salicide) structure on it Alternatively, a metal layer may run parallel to, and over the polysilicon, and be periodically connected to the polysilicon by way of contacts. Such a structure is often referred to as a "strapped" word line.

As device geometries continue to shrink, it would be desirable to arrive at a DRAM memory cell that has small feature sizes (such as short channel lengths) but does not suffer from the short channel effects, parasitic capacitance, or susceptibility to junction spiking. At the same time, it is also desirable to retain a compact memory cell size.

SUMMARY OF THE INVENTION

According to the present invention, a dynamic random access memory (DRAM) cell includes a-pass transistor and a charge storage device. The pass transistor is formed on an epitaxially grown silicon mesa. The top surface of the silicon mesa includes an inset furrow which results in the silicon mesa having a narrow thickness portion below the inset furrow. The channel region of the pass transistor is formed at the narrow thickness portion. A control gate is formed adjacent to the channel region. The narrow thickness of the channel region provides greater control over the channel region, resulting in advantageous charge storage capabilities. In addition, the narrow thickness of the channel region allows for shorter channel dimensions, improving the density of DRAM arrays. The source and drain regions are formed in surrounding thicker portions of the silicon mesa. The thicker source and drain regions result in greater resistance to the adverse effects of contact spiking.

According to one aspect of the preferred embodiment, a control gate is formed above the channel region.

According to another aspect of the preferred embodiment, a control gate is formed below the channel region.

According to another aspect of the preferred embodiment, the pass transistor is a double-gate transistor having a bottom control gate formed below the channel region, and a top gate formed above the channel region.

An advantage of the present invention is that it provides a DRAM memory cell having small transistor dimensions that is not susceptible to the adverse effects of contact spiking.

DETAILED DESCRIPTION OF THE EMBODIMENTS

The preferred embodiment is a novel dynamic random access memory (DRAM) cell and a DRAM array configuration that employs the novel memory cell. The preferred embodiment memory cell allows for reduced channel lengths with improved resistance to contact spiking. In addition, the preferred embodiment memory cell allows for increased storage capacitor capacitance, reduced source-to-drain leakage, and reduced parasitic capacitance.

Figure 3:
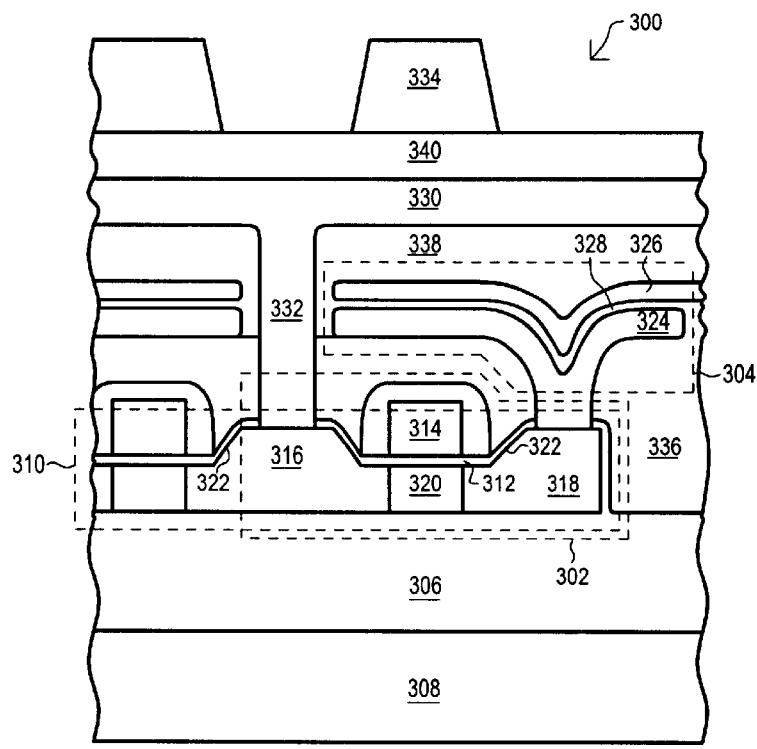
FIG. 3 is side cross-sectional view illustrating a DRAM cell according to a first embodiment.

Referring now to FIG. 3, a side cross sectional view of the first embodiment memory cell is set forth in detail. The memory cell is designated by the general reference character 300 and is formed using silicon-on-insulator (SOI) technology. The memory cell 300 is shown to include a pass transistor 302 and a storage capacitor 304, both formed on a substrate insulator layer 306. The substrate insulator layer 306 is formed over a monocrystalline semiconductor substrate 308.

The pass transistor 302 includes a silicon mesa 310 formed on the substrate insulator layer 306. A top gate insulating layer 312 is disposed on the top surface of the silicon mesa 310, and a top gate 314 is formed on the top gate insulating layer 312. The silicon mesa 310 further includes a source region 316, a drain region 318, and a channel region 320 formed below the top gate 314. In addition, the silicon mesa 310 includes inset furrows 322 that extend into the top surface of the silicon mesa 310. The furrows 322 result in the channel region 320 having a smaller thickness than that of the source region 316 and drain region 318.

The storage capacitor 304 is shown to include a storage node 324 and a common plate 326 separated by a capacitor dielectric 328. The drain region 318 of the pass transistor 302 is coupled to the storage capacitor 304 by the storage node 324. The source region 316 of the pass transistor 302 is coupled to a bit line 330 by a contact region 332. In the first embodiment 300, the source region 316 is shared with an adjacent pass transistor. The adjacent pass transistor includes a furrow 322, so that the adjacent transistor has a source region, drain region, and channel region with the same thickness as that of pass transistor 302 (most notably, the channel region of the adjacent transistor has a smaller thickness than its adjacent source and drain regions).

The first embodiment the memory cell 300 further includes a word line strap 334 disposed above the bit line 330. As will be described in more detail below, the word line strap 334 is coupled to top gate 314 to provide a lower overall word line resistance.

The first embodiment substrate 308 is P-doped monocrystalline silicon formed by boron doping. Alternatively, the substrate 308 can be N-doped monocrystalline silicon formed by phosphorous or arsenic doping. The substrate insulating layer 306 is formed by implanting oxygen into the substrate 308, and then performing an annealing step to form an insulating layer of silicon dioxide ($SiO_2$).

In the embodiment set forth in FIG. 3, the silicon mesa 310 is formed over on the substrate insulator layer 306 by first forming a thin layer of monocrystalline silicon using an epitaxial lateral growth, or selective epitaxial growth step. Preferably, the epitaxial silicon has a thickness of about 1000 angstroms. In the creation of the first embodiment 300, during the epitaxial growth step, silicon is grown over the chip area as a single layer.

Once the epitaxial silicon is grown over the substrate insulator layer 306, the epitaxial silicon is subjected to a local oxidation of silicon (LOCOS) step to create the furrows 322. In the first embodiment 300, a layer of silicon nitride is deposited over the epitaxial silicon. Oxidation openings are then etched in the silicon nitride at those locations where the furrows 322 are to be formed, creating a LOCOS mask. In the first embodiment 300, the oxidation openings are situated in the same general location as the top gate 314. The epitaxial silicon is then subjected to a wet oxidation step to form a relatively thick oxide growth at the oxidation openings. The thick oxide growth will extend into the epitaxial silicon layer. The nitride LOCOS mask is then removed. Subsequently, the oxide layer on the epitaxial silicon layer is removed by a wet chemical etch. The resulting structure is an epitaxial layer having furrows 322 formed where the thick oxide growth was removed. In the first embodiment, the epitaxial silicon layer below the furrow 322 has a thickness of about 500 angstroms.

The epitaxial silicon layer is then doped with boron to create a layer of P-type doped epitaxial silicon. Alternatively, P-doped epitaxial silicon could be formed when the epitaxial silicon is first deposited by in situ doping.

Once a layer of doped epitaxial silicon is formed that includes inset furrows 322, transistor active areas are formed by a pattern and etch step. The pattern and etch step results in a number of isolated silicon mesas (including the silicon mesa 310). Alternatively, active areas can be created by another local oxidation of silicon (LOCOS) step performed on the epitaxial silicon. Unlike the initial LOCOS step, which created an oxide growth that extends only part way into the epitaxial silicon, the isolation LOCOS step would result in oxide growths that extend through the entire thickness of the epitaxial silicon, isolating active regions from one another.

It is understood that in the first embodiment memory cell 300 the source region 316 (and contact region 332) are shared by an adjacent pass transistor, therefore, the resulting isolated silicon mesa 310 will include enough area to form the drain region 318, channel region 320, the shared source region 316, and in addition, a channel region and drain region for an adjacent pass transistor.

Once an isolated silicon mesa 310 is formed, the top gate insulating layer 312 is created on the top surface of the silicon mesa 310. The top gate insulating layer 312 may be thermally grown $SiO_2$, or alternatively, a combination of a thermally grown $SiO_2$ layer followed by a thin layer of silicon nitride deposited by chemical vapor deposition (CVD).

In order to form the top gate 314, a polysilicon layer is deposited over top gate insulating layer 312, including within the furrows 322. A pattern and etch step is then used to form the top gate 314 within the furrow 322 above the channel region 320. It is understood that, in the first embodiment memory cell 300, the top gate 314 extends along a portion of, or the entire length of, a memory cell array in the row direction. Thus, the top gate 314 can also be designated as a word line. It is also noted that a top gate for the adjacent pass transistor is also formed at this time.

A layer of CVD $SiO_2$ is deposited over the top gate 314, and subsequently etched to create oxide "sidewalls" on the edges of the top gate 314. Blanket ion implantation of phosphorous and arsenic is performed, to create the N-type drain region 318 and the N-type source region 316 that are self-aligned with the top gate 314. The drain region of the adjacent transistor is also formed at this time. The common source region 316, is thus self-aligned with top gate 314, and a top gate of the adjacent transistor. The blanket implant of phosphorous and arsenic also serves to reduce the resistance of the top gate 310. After a thermal annealing step, the top gate 314, drain region 318, and source region 316, may have their effective resistance reduced with the formation of a self-aligned silicide (salicide), by the deposition of a metal followed by a furnace anneal. Examples of metals that may be used to form silicide include titanium (Ti), platinum (Pt), cobalt (Co) or nickel (Ni).

The sharing of the source region 316 with an adjacent pass transistor, allows for the single silicon mesa 310 to include two pass transistors in a very close proximity to one another. This aspect of the preferred embodiment 300 provides for a compact memory cell arrangement, which can substantially reduce overall DRAM array size.

It is further that the use of the silicon mesa 310 eliminates the source-drain junction capacitance, giving the pass transistor 302, and hence the memory cell 300, improved performance.

It is also noted, that while the top gate 314 of the first embodiment 300 is formed from polysilicon, other conductive materials could also be employed. As just one example, tantalum (Ta) may be deposited and etched to form a top gate structure. Such a Ta deposition step could include a sputtering deposition carried out by a dual frequency-excitation process.

A first inter-level dielectric (ILD) 336 is formed over the pass transistor 302 structure. In the first embodiment 300, the first ILD 336 is borophosphosilicate glass (BPSG) deposited by chemical vapor deposition. For increased planarization, and hence improved topography for subsequent fabrication steps, the BPSG is subjected to a reflow step.

The BPSG is then subjected to a contact etch to create a contact hole above the drain region 318. A conductive layer is then deposited and subsequently patterned to form the storage node 324. In the first embodiment 300, the storage node 324 may be formed by a low pressure CVD textured, or rugged hemispherical-grain, polysilicon layer. The use of textured or hemispherical-grain polysilicon increases the surface area of the storage node 324, which in turn, will increase the capacitance of the resulting storage capacitor 304. The capacitor dielectric 328 is formed on the storage node 324, and in the first embodiment 300, may be a multi-layered dielectric of $SiO_2/Si_3N_4/SiO_2$(ONO). The ONO capacitor dielectric 328 may be created by the thermal oxidation of the storage node 324, followed by low pressure CVD $Si_3N_4$, and the thermal oxidation of the $Si_3N_4$. Once the capacitor dielectric 328 is complete, the common plate 326 is formed over the capacitor dielectric 328 (and over the capacitor dielectrics of other storage capacitors in an array). In the first embodiment 300, the common plate 326 is formed from a layer of deposited polysilicon.

While the first embodiment capacitor dielectric 328 is an ONO dielectric film, it may be desirable to use other materials to improve the capacitance or the reliability of the resulting memory cell. One such material may be a dual layer film of $SiO_2/Si_3N_4$ (ON). Yet another example could include a single layer film of $SiO_2$. The use of $SiO_2$ would give less capacitance per area, given the same thickness as the ONO dielectric film. In addition, because tunneling across the capacitor dielectric 328 may represent a significant amount of leakage for very thin capacitor dielectrics, another alternative approach to forming the capacitor dielectric 328 could include the rapid thermal nitridation of the storage node 324 prior to the chemical vapor deposition of the $Si_3N_4$. It may also be desirable to perform an in situ surface cleaning of the native polysilicon storage node 324 layer before the rapid thermal nitridation, with the remaining capacitor dielectric formation steps being carried out in an identical chamber process.

Materials having a dielectric constant greater than that of silicon oxide and/or silicon nitride may also be employed, to increase the capacitance of the storage capacitor 304. As just one example, a tantalum pentoxide ($Ta_2O_5$) film may be formed over the storage node 324. This may be accomplished by low-pressure or plasma enhanced chemical vapor deposition followed by a high temperature annealing step. In addition, it noted that the storage node 324 surface may be treated by rapid thermal nitridation in $NH_3$ prior to the deposition of $Ta_2O_5$. Other high dielectric materials that may be employed as capacitor dielectrics include epitaxially grown $SrTiO_3$ (strontium titanium oxide) or $BaSrTiO_3$ (barium strontium titanium oxide), or PZT (lead zirconate titanium).

It is also understood that while the first embodiment 300 includes a storage node 324 and common plate 326 formed from polysilicon, other conductive materials could be employed. For example, titanium-nitride (TiN) or aluminum (Al) may be used to form the common plate 326. Alternatively, a multi-layered material, such as a TiN/polysilicon material could be used to form the common plate 326.

It is understood that at the same time the storage capacitor 304 is being formed, a similar storage capacitor is formed simultaneously for the adjacent pass transistor. The storage node and capacitor dielectric of the adjacent storage capacitor are isolated from storage capacitor 304. In contrast, the common plate 328 is shared not only with the adjacent storage capacitor, but also with a plurality of other storage capacitors within an array.

The stacked capacitor provides increased capacitance by extending above and over its associated pass transistor. Thus, the combination of the pass transistor with a reduced channel thickness provides a memory cell with and increased capacitance and low leakage characteristics.

Referring once again to FIG. 3, it is shown that a second ILD 338 is formed over the completed storage capacitor 304. The second ILD 338 is subjected to a contact etch step, which results in a contact hole that extends through an opening in the common plate 326, through the first ILD 336 and the top gate insulating layer 312 to the source region 316. The contact hole is filled with a conductive material to create the contact region 332. In the first embodiment 300, the contact hole is filled with tungsten (W), to form a tungsten "plug." A CMP step can then be used to planarize the surface. The junction between the contact region 332 and the source region 316 may result in the inter-diffusion of the material between of the contact region 332 into the source region 316 (contact spiking). However, because the source region 316 has a greater thickness than the channel region 320 the likelihood of such contact spiking having adverse effect on the performance of the pass transistor 302 is reduced.

Once the contact region 332 is formed, a conductive layer is then deposited on the planarized second ILD 338 surface, to make contact with the contact region 332. The conductive layer is subsequently etched to form the bit line 330. In the first embodiment 300, the bit line 330 is formed from titanium-tungsten (TiW), and serves to commonly couple a column of identical memory cells.

A third ILD 340 is deposited over the bit line 330. The third ILD 340 is then etched to create strapping contact holes (not shown) which extend through the first, second and third ILDs (336, 338 and 340) to the top gate 314. The strapping contact holes are filled with a conductive material to form strapping vias. The strapping vias could be formed from, as just one example, a W plug. A conductive layer is then deposited on the third ILD 340, making contact with the strapping vias. The deposited conductive layer is then etched to form the word line strap 334.

The use of a channel region 320 having a reduced thickness has the advantage of reducing the leakage current from the drain region 318 to the source region 316. The reduced thickness channel region 320 provides for a small transistor size, that allows for increased control over the electric field in the channel region 320. This results in reduced leakage current when the pass transistor 302 is turned off. This aspect of the first embodiment 300 is particularly advantageous when employed in a DRAM memory cell. By reducing the leakage current drawn between the source region 316 and the drain region 318, charge can be retained for a relatively long period of time on the storage capacitor 304. This can result in considerable power savings in the operation of DRAM, as the DRAM can go for a longer period of time before a refresh operation is required. At the same time, the reduced size of the pass transistor 302 can allow for array configurations of increased density.

In alternative embodiments, the bit line 330 and word line strap 334 may be composed of metals such as Al, cladded by refractory metals combinations, such as TiN or TiW. Furthermore, the Al layer may include a small percentages of silicon (Si) to further reduce the contact spiking. Alternatively, the bit line 330 and word line strap 334 may be copper (Cu) based and constructed by electrolytically plating the Cu into trenches etched into the $SiO_2$, followed by a CMP step.

It is understood, that although the memory cell 300 in FIG. 3 is shown as a "capacitor-under-bit line" stacked cell structure, a "capacitor-over-bit line" (COB) stacked cell structure may be implemented by forming the bit line 330, before the storage capacitor 304. For example, after the formation of the first ILD 336, instead of etching a hole to the drain region 318, a bit line contact hole could be etched to the source region 316. The contact region 332 would then be formed within the resulting hole. A planarization step (such as CMP) follows, and a conductive layer could be deposited and etched to form the bit line 330. Thus, in the COB-type embodiment, the bit line 330 is situated on, and the contact region 332 extends through, the first ILD 336, instead of the first and second ILDs (336 and 338).

The making of the COB-type embodiment could then continue with the deposition of the second ILD 338. This layer could be planarized by a CMP step. A storage node hole would then be etched through the first and second ILDs (336 and 338) to the drain region 318. The storage node 324 would then be formed within the storage node hole, and the capacitor dielectric 328 and common plate 326 formed as previously described. A third ILD 340 is then formed over the storage capacitor 304. The word line strapping arrangement can then be formed as previously described.

It is also understood that the storage capacitor of the DRAM cell may be implemented in the form of a trench capacitor. In such an arrangement, following the formation of the pass transistor 302, an anisotropic reactive ion etch can be used to form a trench in contact with, or adjacent to the drain region 318. The storage node, capacitor dielectric and common plate can then be formed within the trench to create a trench-type storage capacitor.

A memory array incorporating the first embodiment memory cell 300 could include a strip running parallel to the column direction within the array that is void of memory cells, referred to as a "strapping area." The strapping area can serve as a location for the strapping vias. This arrangement allows word line connections within the array to be made in a single strip in a column-wise direction, so that the remainder of the array (particularly those portions having memory cells) can have a compact configuration.

Figure 4:
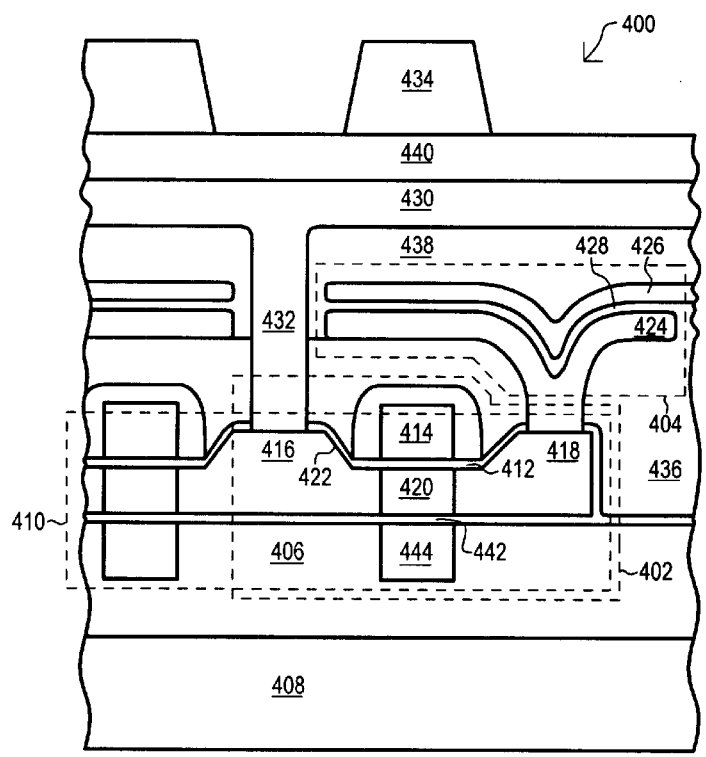
FIG. 4 is side cross-sectional view illustrating a DRAM cell according to a second embodiment.

Referring now to FIG. 4, a second embodiment memory cell is set forth in a side cross-sectional view. The second embodiment is designated by the general reference character 400, and includes many of the same constituents as the embodiment set forth in FIG. 3. To this end, like constituents will be referred to by the same reference character, but with the first number being a "4" instead of a "3." Thus, the second embodiment 400 includes pass transistor, designated as 402, and a storage capacitor, designated as 404.

The second embodiment 400 differs from that set forth in FIG. 3, in that the pass transistor 402 further includes a bottom gate insulating layer 442 and a bottom gate 444, resulting in a "double-gate" transistor structure. The second embodiment 400 is fabricated in a similar manner to the first embodiment 300, with certain differences noted below.

In the second embodiment 400, following the formation of the substrate insulating layer 406, a reactive ion etch is applied to create a trench within the substrate insulating layer 406. A layer of amorphous polysilicon is deposited over the etched insulating layer 406, with the thickness of the polysilicon layer being sufficient to completely fill the trench. The amorphous polysilicon is then doped with arsenic and/or phosphorous to improve its conductivity. A chemical-mechanical polishing (CMP) step is then performed to remove, in a planar fashion, all of the amorphous silicon, except for that portion which fills the trench. The resulting structure forms a bottom gate 444. It is understood that the bottom gate 414, like the top gate 414, extends along a portion of, or the entire length of, a memory cell array in the row direction. The bottom gate 444 can thus be considered a bottom word line, and the top gate 414 can be considered a top word line.

Following the creation of the bottom gate 444, a bottom gate insulating layer 442 is formed over the bottom gate 444. The bottom gate insulating layer 442 may be thermally grown $SiO_2$, or alternatively, a combination of a thermally grown $SiO_2$ followed by a thin layer of silicon nitride deposited using a CVD step. The silicon mesa 410 and top gate insulating layer 412 are then formed as the same fashion as the first embodiment 300.

In the second embodiment 400, to ensure that the top gate 414 is driven in tandem with the bottom gate 444, both the top gate 414 and bottom gate 444 are electrically connected. This connection is accomplished by way of gate via (not shown). Following the formation of the top gate insulating layer 412, an etch step is performed to create a top-to-bottom gate via opening (not shown). Following the top-to-bottom gate via etch, a polysilicon layer is deposited over top gate insulating layer 412. Due to the gate via opening, the polysilicon layer will make ohmic contact with the bottom gate 444, forming a top-to-bottom gate via.

It is noted that the same variations of gate material noted for the top gate 314 of the first embodiment 300 could be applicable to the second embodiment 400. Accordingly, while the bottom gate 444 and top gate 414 of the second embodiment 400 are formed from polysilicon, alternate conductive materials could also be employed.

The use of the bottom gate 444 and top gate 414 (i.e., "double-gate") pass transistor 402 allows for a reduced channel length, because adverse short channel effects can be reduced. This translates into a smaller overall cell area, leading to a denser DRAM array arrangement. Further, the tandem driving of the top and bottom gates (414 and 444) provides greater channel control than the single gate arrangement of the first embodiment 300.

The formation of the remaining constituents of the second embodiment 400 follows according to the first embodiment 300.

In the second embodiment 400, the top-to-bottom gate vias in conjunction with the strapping vias, reduces the effective resistance of the top gate 414 and bottom gate 444, for improved speed in accessing the memory cell 400. It is noted that, in the event the top-to-bottom gate via introduces too much resistance into the word line structure, the memory cell 400 could include a bottom gate strap via that connects the bottom word line directly to the word line strap 434. In the second embodiment, the top-to-bottom gate vias can be situated within a strapping area, along with the strapping vias.

Figure 5:
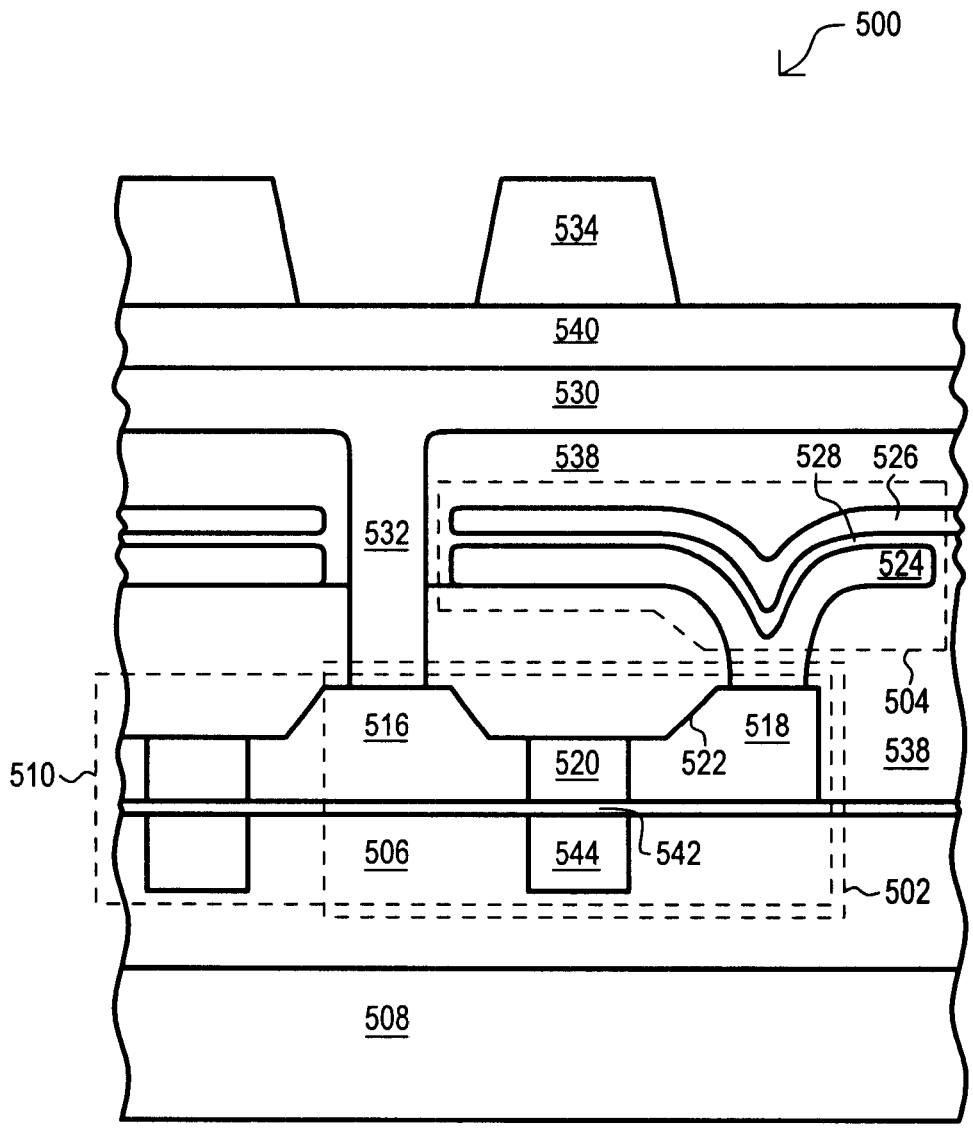
FIG. 5 is a side cross-sectional view illustrating a DRAM cell according to a third embodiment.

Referring now to FIG. 5, a third embodiment memory cell is set forth in a side cross-sectional view. The third embodiment is designated by the general reference character 500, and includes many of the same constituents as the second embodiment 400 shown in FIG. 4. Thus, in a similar fashion to FIG. 4, constituents of the third embodiment will be referred to by the same reference characters as the second embodiment 400, but with the first number being a "5" instead of a "4." Thus, as an example, the third embodiment 500 includes a pass transistor 502 and a storage capacitor 504 corresponding to the pass transistor 402 and storage capacitor 404 of FIG. 4.

The third embodiment 500 differs from the second embodiment 400 of FIG. 4, in that the pass transistor 502 does not include a top gate or top gate dielectric. Instead, inversion of the channel region 520 is accomplished by way of the bottom gate 544 only. Thus, in the third embodiment 500, following the isolation of the silicon mesa 510 via a reactive ion etch (or alternatively a LOCOS step) there is no need to form a top gate insulating layer or a top gate. To form the source and drain regions (516 and 518) the silicon mesas 510 can be formed by an ion implant, but without a polysilicon gate as the mask. The mask can be the LOCOS or another sacrificial layer such as a resist layer. The formation of the remainder of the third embodiment 500 constituents follows according to the second embodiment 400.

Among the advantages of the third embodiment 500 are those that follow from the reduced channel thickness, decreased susceptibility to contact spiking, and compact cell size, previously noted in conjunction with the first and second embodiments (300 and 400). In addition, unlike the first and second embodiments (300 and 400), the third embodiment 500 provides even greater area for the storage capacitor 504 as there is no top gate. The third embodiment 500 may be particularly suited for storage capacitors having "fins" (i.e., a storage node 524 having multiple laterally extending portions that are covered by the capacitor dielectric and common plate). Furthermore, the third embodiment eliminates the necessity for contact-to-word line, and plate-to-word line spacing. This not only provides for denser arrays, but also allows greater freedom in the layout of the array.

Figure 1:
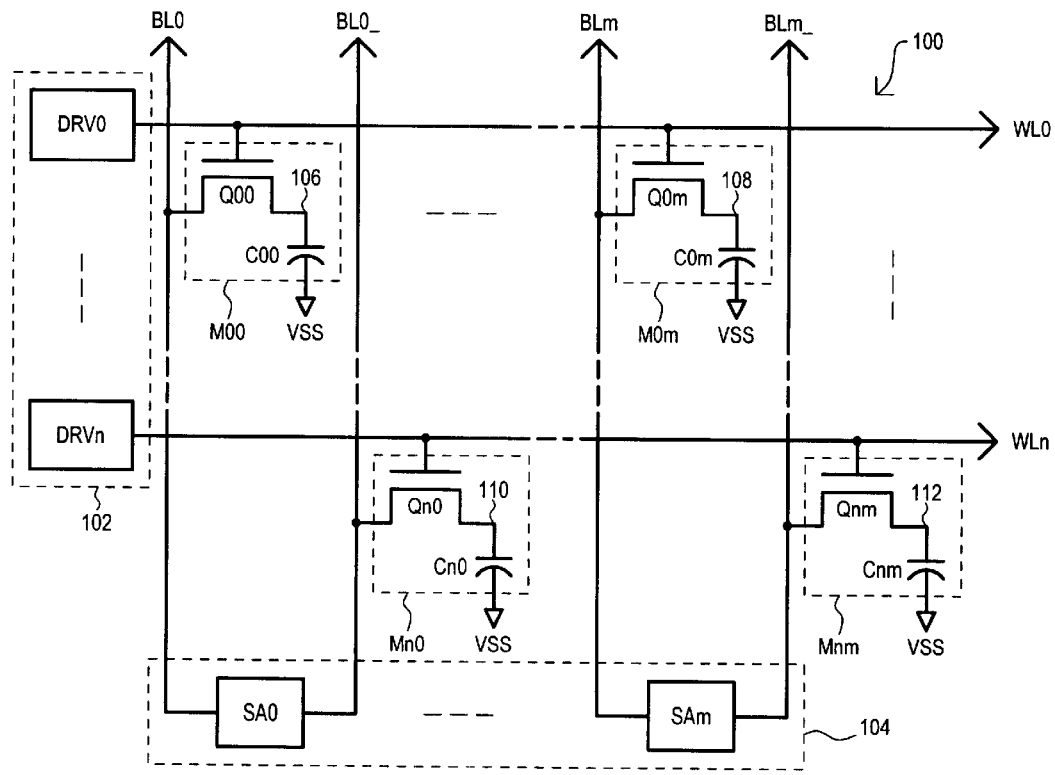
FIG. 1 is a block schematic diagram of a prior art DRAM array.
Figure 2:
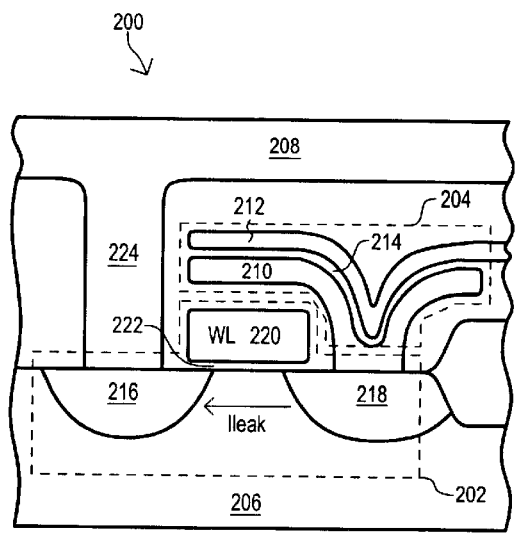
FIG. 2 is a side cross-sectional view of a prior art DRAM cell.
Figure 6:
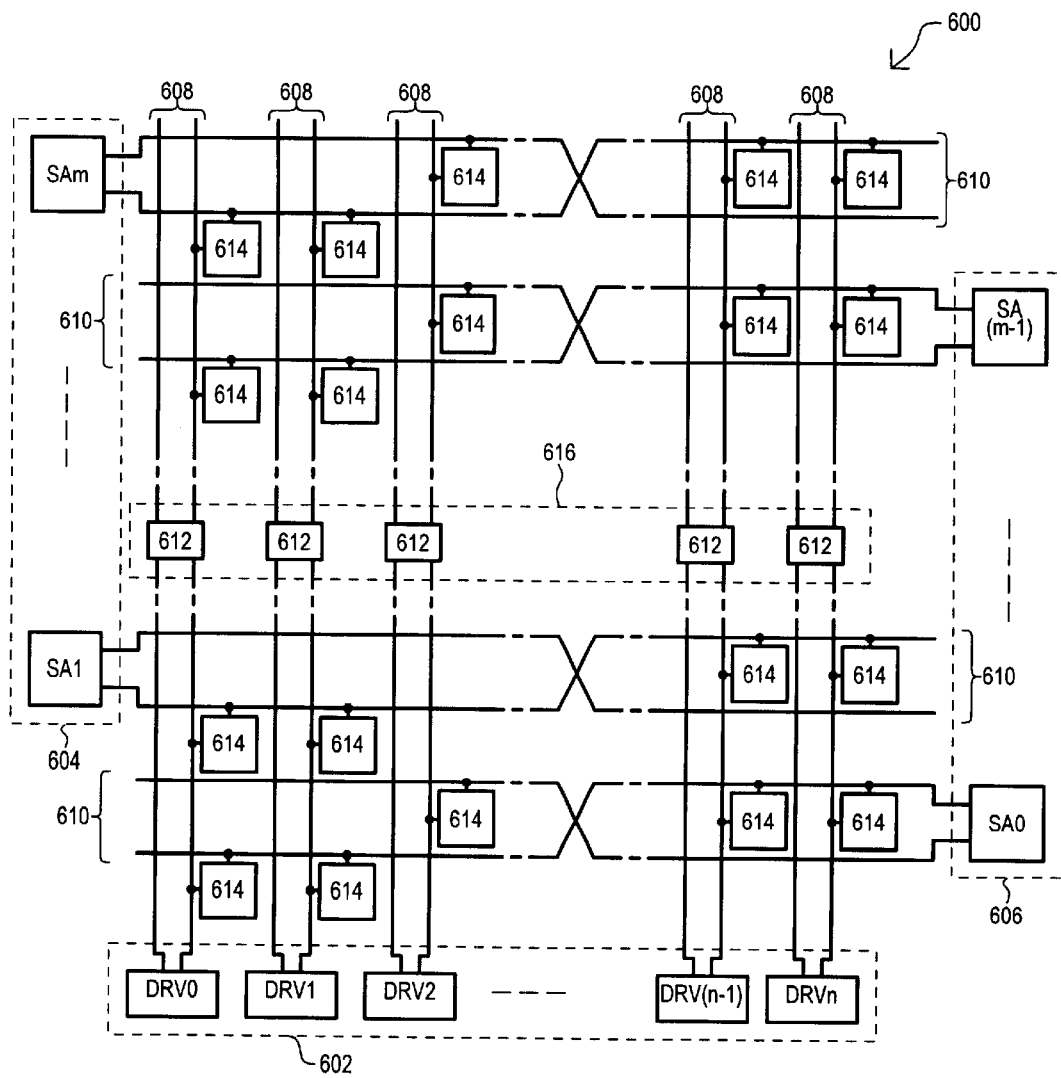
FIG. 6 is a block schematic diagram illustrating a DRAM array according to the preferred embodiment.

Referring now to FIG. 6, a block schematic is set forth, illustrating a DRAM array according to the preferred embodiment. The DRAM array includes a plurality of DRAM cells, each having the structure set forth in FIG. 3, 4 or 5, and described in detail above. The memory array is designated by the general reference character 600, and includes a word line driver section 602, a left sense amplifier section 604, a right sense amplifier section 606, a plurality of word lines 608, a plurality of bit line pairs 610, and a plurality of word line strap structures 612. The memory cells 614 are formed at the intersection of bit lines 610 and the word lines 608. The word line driver section 602 contains a word line driver (DRV0–DRVn) corresponding to each word line 608 in the memory array 600. Each word line driver (DRV0–DRVn) drives a word line and a word line strap. It is noted that in the event the memory cells have the double-gate configuration of the second embodiment memory cell 400 set forth in FIG. 4, each word line driver (DRV0–DRVn) would further drive a bottom gate. Because the use of a word line strap in conjunction with a word line (or two word lines in the double-gate case), the capacitive load presented by each word line 608 may require word line driver (DRV0–DRVn) to have a drive strength that is greater than that of the prior art word line drivers set forth in FIG. 1.

Figure 7:
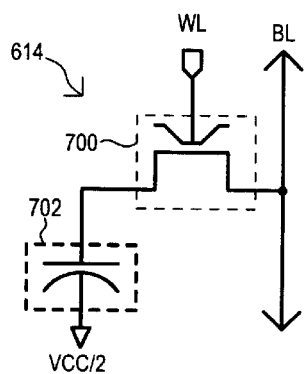
FIG. 7 is a schematic diagram of a memory cell of the preferred embodiment DRAM array of FIG. 6.

Referring now to FIG. 7, a schematic diagram of a memory cell is set forth in detail. The memory cell is designated by the general reference character 614, and includes a pass transistor 700 having a reduced thickness channel region and a storage capacitor 702. The memory cell 614 can represent the first and third embodiment memory cells (300 and 500). In the event the double-gate second embodiment 400 was utilized, a second gate would also be included.

As noted above, each polysilicon word line is strapped to a metal word line strap to reduce the effective resistance of the word lines 608 and improve the speed of the memory. The word line strap connection occurs at the word line strap structures 612, which are evenly spaced along the length of the word lines 608. In the preferred embodiment array 600, the word line strapping structures 612 are aligned with one another in the bit line direction, resulting in the formation of a column of word line straps 616. The column of word line straps 616 is void of memory cells, providing sufficient room for the placement of strapping vias, and, in the case of a memory array having double-gate transistors, top-to-bottom word line vias. The frequency of word line strap columns 616 within the array 600 is dependent upon the desired effective resistance of the word lines in the memory array.

Figure 8:
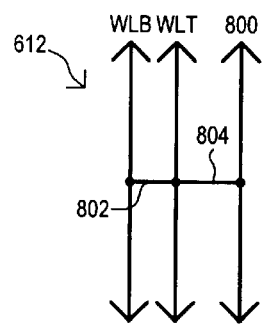
FIG. 8 is a schematic diagram of a word line strap structure of the preferred embodiment DRAM array of FIG. 6.

FIG. 8 sets forth a schematic representation of a word line strapping structure of the preferred embodiment array 600, when memory cells having both a top and bottom word line are used (i.e., the memory cells have a structure such as that set forth in FIG. 4). The word line strapping structure is designated by the general reference character 612 and is shown to include a bottom word line WLB, a top word line WLT, and a word line strap 800. The bottom word line WLB is shown to be coupled to the top word line WLT by a top-to-bottom word line via 802. The word line strap layer 800 is connected to the top word line WLT by a strapping via 804.

If reference is made to FIG. 6 in conjunction with FIG. 4, the word line strap layer 800 of FIG. 8 corresponds to the word line strap 434 of FIG. 4. As such, in the preferred embodiment, the word line strap layer 800 is a metal, such as Al. The top word line (WLT) of FIG. 8 corresponds with the top gate 414 of FIG. 4, and is formed from polysilicon. The bottom word line (WLB) of FIG. 8 corresponds with the bottom gate 444 of FIG. 4, and is made from an initial deposition of amorphous silicon. As was previously noted, the function of the word line strapping structure 612 is to reduce the resistance of the word lines (WLB and WLT). As seen in FIG. 8, both word lines (WLB and WLT) are coupled to the word line strap layer 800 in the word line strap structures 412. It is understood that the strapping structures used in correlation with the embodiments set forth in FIGS. 3 and 5 do not contain a bottom word line (WLB) or a word line via.

If reference is made to FIG. 4, the bottom gate 444 of FIG. 4 does not have a silicide layer to reduce resistance, thus it is important that the bottom word line WLB be coupled to the metal word line strap layer 800, either directly, or by way of the top word line WLT.

Referring once again to FIG. 6, the left sense amplifier section 604 and the right sense amplifier section 606 are shown to be disposed on opposite sides of the array 600. In order to access every memory cell 614 within array 600, it is necessary to have a sense amplifier for every pair of bit lines 610 in the memory array 600. Because there are two sense amplifier sections (604 and 606), half of the sense amplifiers are in the left sense amplifier section 604, and the other half are in the right sense amplifier section 606. This arrangement allows for greater "pitch" (area in the column direction) per sense amplifier, making the layout of the sense amplifiers more efficient. The left sense amplifier section 604 can be considered to be coupled to the odd bit lines 610, thus the sense amplifiers within are designated by odd numbers (SA1, SA3, SA5 . . . SAm). The right sense amp section 606 can be considered to be coupled to the even bit lines 610, and so includes sense amplifiers having an even number designation (SA0, SA2, SA4 . . . SA(m−1)).

As set forth in FIG. 6, in the preferred embodiment 600, the pairs of bit lines 610 are "twisted" at their midpoint. This arrangement results in any noise on the bit lines being common mode noise. Noise sources can include signals coupled to the bit lines from parallel lines running above or below (for example y-select lines—not shown in FIG. 6). The sense amplifiers (SA0–SAm) of the preferred embodiment 600 have high common mode rejection ratios thus the common coupled noise is less likely to result in noise induced sensing errors.

The preferred embodiment array 600 can form part of a DRAM memory device. Such a device would also include a periphery area. While the array 600 would include NMOS devices, the periphery could include the logic and decoding circuits, formed with complementary metal(conductor)-oxide(insulator)-semiconductor (CMOS) technology. The CMOS devices could include conventional (i.e., source, drain and channel regions of equal thickness) transistors. Alternatively, the preferred embodiment array 600 could be implemented as an integrated memory in a larger function semiconductor device.

Although the present invention has been described in terms of a detailed preferred embodiment, it should be understood that various changes, substitutions, and alterations could be made without departing from the spirit and scope of the invention as defined by the appended claims.

What is claimed is:

1. A semiconductor memory device, comprising:
   a first bit line; and
   a first memory cell including
      a first storage capacitor; and
      a first pass transistor coupled between the first bit line and the first storage capacitor, the first pass transistor including,
         a source region coupled to the first bit line, the source region having a source region thickness,
         a first drain region coupled to the first storage capacitor, the first drain region having a first drain region thickness,
         a first channel region disposed between the source region and the first drain region, the first channel region having a first channel region thickness that is less than the source region thickness, and
         a first gate disposed adjacent to the channel region and separated therefrom by a first gate insulating layer.

2. The semiconductor memory device of claim 1, wherein:
   the first channel region thickness is also less than the first drain region thickness.

3. The semiconductor memory device of claim 1, wherein:
   the first storage capacitor includes
      a first storage node coupled to the first pass transistor,
      a first capacitor dielectric formed on the first storage node, and
      a first top plate formed over the first capacitor dielectric.

4. The semiconductor memory device of claim 1, wherein:
   a second memory cell including
      a second storage capacitor, and
      a second pass transistor coupled between the first bit line and the second storage capacitor, the second pass transistor including,
         the source region,
         a second drain region coupled to the second storage capacitor, the second drain region having a second drain region thickness,
         a second channel region disposed between the first source region and the second drain region, the second channel region having a second channel region thickness that is less than the source region thickness, and
         a second gate disposed adjacent to the second channel region and separated therefrom by a second gate insulating layer.

5. The semiconductor memory device of claim 4, wherein:
   the second channel region thickness is also less than the second drain region thickness.

6. The semiconductor memory device of claim 4, wherein:
   the second storage capacitor includes
      a second storage node coupled to the second pass transistor,
      a second capacitor dielectric formed on the second storage node, and
      the first top plate formed over the second capacitor dielectric.

7. The semiconductor memory device of claim 4, further including:
   a sense amplifier coupled to the first bit line, the sense amplifier sensing the data stored in the first memory cell when the first memory cell is selected, and sensing data in the second memory cell when the second memory cell is selected.

8. The semiconductor memory device of claim 7, further including:
   a second bit line coupled to the sense amplifier; and
   the first bit line and the second bit line form a twisted bit line pair.

9. The semiconductor memory device of claim 1, further including:
   a word line driver coupled to the first gate that forms a portion of a word line.

10. The semiconductor memory device of claim 9, further including:
    a word line strap coupled to the word line driver and to the word line, the word line strap being formed from a conductive material having a lower resistance than the first gate.

11. The semiconductor memory device of claim 1, further including:
    the first gate is disposed adjacent to a top surface of the first channel region.

12. The semiconductor memory device of claim 1, further including:
    the first gate is disposed adjacent to a bottom surface of the first channel region and coupled to a word line driver.

13. The semiconductor memory device of claim 1, further including:
the first gate being disposed over a top surface of the first channel region; and
a second gate coupled to a word line driver disposed over a bottom surface of the first channel region and separated therefrom by a second gate insulating layer.

14. The semiconductor memory device of claim 13, further including:
the word line driver is further coupled to the first gate.

15. A dynamic random access memory cell, comprising:
a storage capacitor; and
a pass transistor including
a source region having a source thickness,
a drain region having a drain thickness,
a channel region disposed between the source region and the drain region, the channel region having a thickness that is less than the source region,
a first gate insulating layer formed on the channel region, and
a first gate formed on the first gate insulating layer.

16. The semiconductor memory device of claim 15, wherein:
the source region, drain region and channel region are formed in a monocrystalline silicon mesa structure.

17. The semiconductor memory device of claim 16, wherein:
the silicon mesa structure includes a top surface and a furrow that is inset with respect to the top surface, the channel region being disposed below the furrow.

18. The semiconductor memory device of claim 16, wherein:
the monocrystalline silicon mesa structure is formed on a substrate insulating layer.

19. The semiconductor memory device of claim 18, wherein:
the substrate insulating layer includes silicon dioxide.

20. The semiconductor memory device of claim 18, wherein:
the substrate insulating layer includes a trench, and
the first gate is formed within the trench.

21. The semiconductor memory device of claim 20, wherein:
the pass transistor further includes a second gate formed over the channel region and separated therefrom by a second gate insulating layer.

22. The semiconductor memory device of claim 15, wherein:
the first gate insulating layer includes thermally grown silicon dioxide.

23. The semiconductor memory device of claim 15, wherein:
the first gate includes polysilicon.

24. A dynamic random access memory array, comprising:
a plurality of memory cells, arranged into a plurality of generally parallel rows, each memory cell including
a pass transistor, the pass transistor including
a channel region defined by first, second, third and fourth sides, the first and second sides being opposite from one another, the third and fourth sides being opposite from one another, and the channel region having a channel thickness,
a source region adjacent to the first side of the channel region, the source region having a source thickness that is greater than the channel thickness
a drain region adjacent to the second side of the channel region,
a first gate formed adjacent to the third side of the channel region and separated therefrom by a first gate insulating layer, and
a first word line associated with each row, each first word line being coupled to the first gates of the memory cells within its respective row.

25. The dynamic random access memory array of claim 24, wherein:
the first gates of the transistors within each row are integral portions of the first word line of that row.

26. The dynamic random access memory array of claim 24, wherein:
the first word lines include polysilicon.

27. The dynamic random access memory array of claim 24, further including:
a word line strap associated with each row, each word line strap being disposed generally parallel to the first word line of its associated row, and coupled thereto by at least one strap via.

28. The dynamic random access memory array of claim 27, wherein:
the word line straps include a metal layer.

29. The dynamic random access memory array of claim 24, wherein:
each pass transistor further includes a second gate formed adjacent to the fourth side of the channel region, and separated therefrom by a second gate insulating layer.

30. The dynamic random access memory array of claim 29, further including:
a second word line associated with each row, each second word line being coupled to the second gates of the memory cells within its respective row.

31. The dynamic random access memory array of claim 30, wherein:
the second word lines includes polysilicon.

32. The dynamic random access memory array of claim 30, wherein:
each first word line is coupled to the second word line of its associated row by a plurality of word line vias.

33. The dynamic random access memory array of claim 24, wherein:
the memory cells are further arranged into a plurality of columns arranged in a generally perpendicular fashion to the rows, at least one pair of adjacent columns being separated by a strapping area;
a word line strap associated with each row, each word line strap being disposed generally parallel to the first word line of its associated row, and coupled thereto by at least one strap via; and
the first word lines and word line straps extend across the strapping area, and the strap vias are located within the strapping area.

* * * * *